(12) United States Patent
Matsuura

(10) Patent No.: US 9,396,964 B2
(45) Date of Patent: Jul. 19, 2016

(54) PLASMA PROCESSING APPARATUS, PLASMA PROCESSING METHOD, AND NON-TRANSITORY COMPUTER-READABLE MEDIUM

(75) Inventor: Shin Matsuura, Kurokawa-gun (JP)

(73) Assignee: TOKYO ELECTRON LIMITED (JP)

( * ) Notice: Subject to any disclaimer, the term of this patent is extended or adjusted under 35 U.S.C. 154(b) by 636 days.

(21) Appl. No.: 13/325,757

(22) Filed: Dec. 14, 2011

(65) Prior Publication Data

US 2012/0152914 A1  Jun. 21, 2012

Related U.S. Application Data

(60) Provisional application No. 61/429,571, filed on Jan. 4, 2011.

(30) Foreign Application Priority Data

Dec. 15, 2010  (JP) .................................. 2010-279294

(51) Int. Cl.
  B23K 9/00    (2006.01)
  G05D 11/00   (2006.01)
  E03B 1/00    (2006.01)
  H01L 21/311  (2006.01)
  G03F 7/42    (2006.01)
  H01J 37/32   (2006.01)

(52) U.S. Cl.
  CPC .......... *H01L 21/31138* (2013.01); *G03F 7/427* (2013.01); *H01J 37/32091* (2013.01); *H01J 37/32816* (2013.01); *H01J 37/32935* (2013.01)

(58) Field of Classification Search
  CPC . G03F 7/427; H01L 21/31138; H01L 21/302; H01J 37/32935; H01J 37/32816; B23K 10/00

USPC ............... 219/121.36–121.44; 137/7, 87.01
  See application file for complete search history.

(56) References Cited

U.S. PATENT DOCUMENTS 2,922,869 A * 1/1960 Ducati et al. .................... 219/75
3,948,601 A * 4/1976 Fraser et al. ..................... 422/23
5,272,417 A * 12/1993 Ohmi ........................ 315/111.21

(Continued)

FOREIGN PATENT DOCUMENTS

JP     08-203865     8/1996
JP     2000-173993   6/2000

(Continued)

*Primary Examiner* — David Angwin
*Assistant Examiner* — Gyounghyun Bae
(74) *Attorney, Agent, or Firm* — Cantor Colburn LLP

(57) ABSTRACT

A plasma processing apparatus includes: a process chamber which accommodates a substrate to be processed; a lower electrode disposed in the process chamber; an upper electrode including an electrode plate that is detachable and discharges a process gas inside the form of shower into the process chamber; a gas supply unit including a central pipe and a edge pipe for supplying the process gas to the upper electrode; a first high frequency power source which applies high frequency power for plasma generation to the lower electrode; pressure indicators which detect pressures inside gas supply pipes; and a controller which measures a degree of consumption of the electrode plate based on the pressures detected by the pressure indicators and calculates a variation in process rate resulting due to the consumption of the electrode plate to adjust process conditions to resolve the variation in process rate.

9 Claims, 7 Drawing Sheets

(56) References Cited

U.S. PATENT DOCUMENTS

| | | | | |
|---|---|---|---|---|
| 5,550,344 A | * | 8/1996 | Winterfeldt | 219/121.39 |
| 5,653,896 A | * | 8/1997 | Couch et al. | 219/121.44 |
| 5,656,123 A | * | 8/1997 | Salimian et al. | 156/345.43 |
| 5,707,486 A | * | 1/1998 | Collins | 156/345.49 |
| 5,955,383 A | * | 9/1999 | Hwang | 438/729 |
| 5,976,766 A | * | 11/1999 | Kasuga et al. | 430/313 |
| 6,030,489 A | * | 2/2000 | Hwang | 156/345.26 |
| 6,106,659 A | * | 8/2000 | Spence et al. | 156/345.43 |
| 6,238,588 B1 | * | 5/2001 | Collins et al. | 216/68 |
| 6,335,505 B2 | * | 1/2002 | Billerot | 219/121.55 |
| 6,423,242 B1 | * | 7/2002 | Kojima et al. | 216/79 |
| 6,829,056 B1 | * | 12/2004 | Barnes | H01J 37/32935 118/708 |
| 7,223,676 B2 | * | 5/2007 | Hanawa | C23C 14/48 257/E21.316 |
| 7,294,563 B2 | * | 11/2007 | Al-Bayati | H01J 37/321 438/156 |
| 8,328,981 B2 | * | 12/2012 | Tsujimoto | 156/345.37 |
| 8,524,101 B2 | * | 9/2013 | Chiba et al. | 216/67 |
| 2001/0054605 A1 | * | 12/2001 | Suzuki et al. | 219/121.43 |
| 2002/0001963 A1 | * | 1/2002 | Tadokoro et al. | 438/710 |
| 2002/0125213 A1 | * | 9/2002 | Yamazaki et al. | 216/67 |
| 2004/0107906 A1 | * | 6/2004 | Collins | H01J 37/321 118/723 I |
| 2004/0195590 A1 | * | 10/2004 | Suzawa et al. | 257/200 |
| 2004/0219797 A1 | * | 11/2004 | Honda et al. | 438/709 |
| 2005/0056934 A1 | * | 3/2005 | Suzawa et al. | 257/741 |
| 2005/0115673 A1 | * | 6/2005 | Samukawa et al. | 156/345.28 |
| 2005/0193946 A1 | * | 9/2005 | Wu et al. | 118/715 |
| 2005/0230838 A1 | * | 10/2005 | Ono et al. | 257/764 |
| 2005/0257743 A1 | * | 11/2005 | Koshiishi et al. | 118/723 E |
| 2005/0266593 A1 | * | 12/2005 | Suzawa et al. | 438/30 |
| 2005/0269292 A1 | * | 12/2005 | Koshiishi et al. | 216/67 |
| 2006/0000803 A1 | * | 1/2006 | Koshiishi et al. | 216/67 |
| 2006/0065523 A1 | * | 3/2006 | Hao | H01J 37/3244 204/298.07 |
| 2006/0124169 A1 | * | 6/2006 | Mizusawa et al. | 137/7 |
| 2006/0196847 A1 | * | 9/2006 | Honda et al. | 216/67 |
| 2006/0213867 A1 | * | 9/2006 | Maruyama | 216/67 |
| 2007/0095799 A1 | * | 5/2007 | Matsuzawa et al. | 219/121.4 |
| 2007/0111424 A1 | * | 5/2007 | Suzawa et al. | 438/216 |
| 2007/0131651 A1 | * | 6/2007 | Goto et al. | 216/63 |
| 2008/0110859 A1 | * | 5/2008 | Koshiishi et al. | 216/67 |
| 2008/0141941 A1 | * | 6/2008 | Augustino | C23C 16/45565 118/723 R |
| 2008/0179286 A1 | * | 7/2008 | Murokh | 216/67 |
| 2009/0095451 A1 | * | 4/2009 | Moroz | H01J 21/67248 165/104.33 |
| 2009/0117746 A1 | * | 5/2009 | Masuda | C23C 16/45561 438/710 |
| 2009/0124083 A1 | * | 5/2009 | Nodera | C23C 16/0218 438/694 |
| 2009/0148963 A1 | * | 6/2009 | Ono et al. | 438/5 |
| 2009/0178714 A1 | * | 7/2009 | Sawusch | F17D 5/00 137/12 |
| 2009/0194235 A1 | * | 8/2009 | Kobayashi et al. | 156/345.28 |
| 2009/0223926 A1 | * | 9/2009 | Hirano | 216/61 |
| 2009/0256172 A1 | * | 10/2009 | Lim | H01L 21/02381 257/101 |
| 2010/0101728 A1 | * | 4/2010 | Iwasaki | H01J 37/32192 156/345.33 |
| 2010/0163112 A1 | * | 7/2010 | Mizusawa et al. | 137/4 |
| 2010/0190350 A1 | * | 7/2010 | Yatsuda et al. | 438/710 |
| 2012/0152914 A1 | * | 6/2012 | Matsuura | G03F 7/427 219/121.42 |

FOREIGN PATENT DOCUMENTS

| | | |
|---|---|---|
| JP | 2004531906 | 10/2004 |
| JP | 2006066855 | 3/2006 |
| JP | 2007208194 | 8/2007 |
| JP | 2007535816 | 12/2007 |

* cited by examiner

PLASMA PROCESSING APPARATUS, PLASMA PROCESSING METHOD, AND NON-TRANSITORY COMPUTER-READABLE MEDIUM

CROSS-REFERENCE TO RELATED PATENT APPLICATIONS

This application claims the benefits of Japanese Patent Application No. 2010-279294, filed on Dec. 15, 2010 in the Japan Patent Office, and the U.S. Patent Application No. 61/429,571, filed on Jan. 4, 2011 in the U.S. Patent and Trademark Office, the disclosures of which are incorporated herein in its entirety by reference.

BACKGROUND OF THE INVENTION

1. Field of the Invention

The present invention relates to a plasma processing apparatus for performing plasma processing such as plasma etching, a plasma processing method, and a non-transitory computer-readable medium storing a program for executing the plasma processing method.

2. Description of the Related Art

For example, in a process of manufacturing a semiconductor device, plasma processing, e.g., etching or chemical vapor deposition (CVD), is widely performed on a semiconductor wafer which is a substrate to be processed.

Among various plasma processing apparatuses for performing the plasma processing, a capacity coupled parallel plate plasma processing apparatus is mainly used.

When a capacity coupled parallel plate plasma processing apparatus is used as an etching apparatus, there is generally being employed an apparatus that disposes a pair of parallel plate electrodes, i.e., upper and lower electrodes, in a chamber to introduce a process gas into the chamber, forms a high frequency electric field between the parallel plate electrodes to form plasma by applying high frequency to one of the parallel plate electrodes, and applies high frequency for dragging ions to the lower electrode (for example, Patent Reference 1).

However, when an etching process is performed by using this type of plasma processing apparatus, an electrode plate of the upper electrode is consumed due to repetitive plasma processing, and accordingly, a temperature of the electrode plate is increased. If the temperature of the electrode plate is increased, an etching rate varies.

Accordingly, at a point in time when consumption of the electrode plate is beyond an allowable range of an etching rate, the electrode plate is replaced. Although it is not an example of a plasma electrode, as a method of determining time for replacing an electrode, a method disclosed in Patent Reference 2 is used. In the method disclosed in Patent Reference 2, a tracer is embedded in an electrode, and the electrode is replaced when the tracer is detected.

However, in future, if a semiconductor device is further miniaturized, it is expected that an extremely small variation in etching rate is a problem. In particular, it is expected that the extremely small variation in etching rate is a big problem when a degree of consumption of an electrode plate of an upper electrode is serious. However, it is difficult to resolve such a problem, although the above-described technology is used.

3. Prior Art Reference (Patent Reference 1) Japanese Patent Laid-Open Publication No. 2000-173993

(Patent Reference 2) Japanese Patent Laid-Open Publication No. hei 8-203865

SUMMARY OF THE INVENTION

The present invention is made in view of this problem, and provides a plasma processing apparatus and a plasma processing method that are capable of preventing a variation in etching rate resulting due to consumption of an electrode plate of an upper electrode.

The present invention also provides a non-transitory computer-readable medium storing a program for executing the plasma processing method.

According to an aspect of the present invention, there is provided a plasma processing apparatus for performing plasma processing to a substrate to be processed by using plasma of a process gas, the plasma processing apparatus including: a process chamber which accommodates the substrate to be processed and of which an inside may be evacuated; a lower electrode which is disposed in the process chamber and serves as a holding stage of the substrate to be processed; an upper electrode which is disposed in the process chamber to face the lower electrode and includes an electrode plate that is detachable and discharges the process gas in the form of shower into the process chamber; a gas supply unit including a gas pipe that supplies the process gas to the upper electrode; a high frequency power application unit which applies high frequency power for plasma generation to at least one selected from among the upper electrode and the lower electrode; a pressure indicator which detects pressure inside the gas pipe; and a controller which measures a degree of consumption of the electrode plate based on a value of the pressure inside the gas pipe detected by the pressure indicator and adjusts process conditions to resolve a variation in process rate by calculating the variation in the process rate resulting due to the consumption of the electrode plate.

According to another aspect of the present invention, there is provided a plasma processing method used to perform plasma processing to a substrate to be processed by plasma of a process gas by using a plasma processing apparatus, the plasma processing apparatus including: a process chamber which accommodates the substrate to be processed and of which interior may be evacuated; a lower electrode which is disposed in the process chamber and serves as a holding stage of the substrate to be processed; an upper electrode which is disposed in the process chamber to face the lower electrode and includes an electrode plate that is detachable and discharges the process gas in the form of shower into the process chamber; a gas supply unit including a gas pipe that supplies a process gas to the upper electrode; and a high frequency power application unit which applies high frequency power for plasma generation to at least one selected from among the upper electrode and the lower electrode, wherein a degree of consumption of the electrode plate is measured based on a value of a pressure inside the gas pipe, and process conditions are adjusted to resolve a variation in process rate by calculating the variation in the process rate resulting due to the consumption of the electrode plate.

According to another aspect of the present invention, a non-transitory computer-readable medium operates on a computer and stores a program for controlling a plasma processing apparatus, wherein the program allows the computer to control the plasma processing apparatus to execute the plasma processing method.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
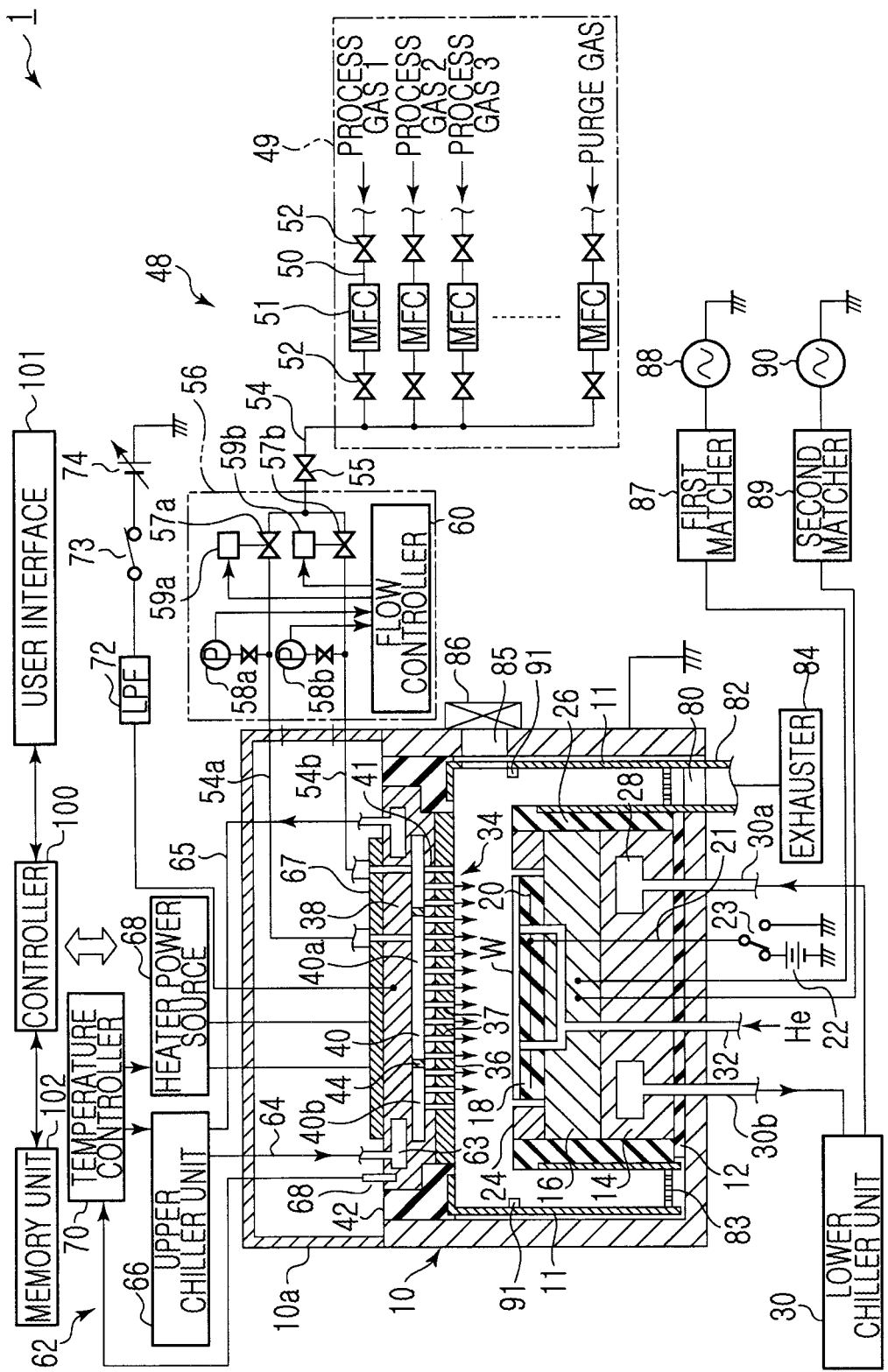
FIG. 1 is a schematic cross-sectional view of a plasma processing apparatus according to an embodiment of the present invention.

FIG. 1 is a schematic cross-sectional view of a plasma processing apparatus according to an embodiment of the present invention.

The plasma processing apparatus 1 is configured as a capacity coupled parallel plate plasma etching apparatus and includes a chamber (a process chamber) 10 having a nearly cylindrical shape and formed of, for example, aluminum of which surface is anodized. The chamber 10 is protectively grounded.

An insulating plate 12 formed of, for example, ceramics, is disposed at a lower portion of the chamber 10, and a susceptor support 14 having a cylindrical shape is disposed on the insulating plate 12. A susceptor 16 formed of, for example, aluminum, is disposed on the susceptor support 14. The susceptor 16 constitutes a lower electrode, and a semiconductor wafer W, which is a substrate to be processed and has a film to be etched, is placed on the susceptor 16.

An electrostatic chuck 18 which adsorbs and holds the semiconductor wafer W by an electrostatic force is disposed on an upper surface of the susceptor 16. The electrostatic chuck 18 has a structure in which an electrode 20 formed of a conductive film is interposed between a pair of insulating layers or insulating sheets. A direct current (DC) power 22 is electrically connected to the electrode 20 via a power feeding line 21. Also, the semiconductor wafer W is adsorbed onto and held by the electrostatic chuck 18 by an electrostatic force, such as a Coulomb force, generated by a DC voltage applied from the DC power 22. In addition, a switch 23, which may turn on/off a DC voltage applied to the electrode 20, is disposed in the power feeding line 21.

A conductive focus ring (a compensation ring) 24 formed of, e.g., silicon, and improving uniformity of etching is disposed on the upper surface of the susceptor 16 to surround the electrostatic chuck 18 (the semiconductor wafer W). An inner wall member 26 having a cylindrical shape and formed of, e.g., quartz, is disposed on lateral surfaces of the susceptor 16 and the susceptor support 14.

A refrigerant chamber 28 having, e.g., a cylindrical shape, is provided inside the susceptor support 14. A refrigerant having a predetermined temperature, e.g., cooling water, is cyclically supplied to the refrigerant chamber 28 via pipes 30a and 30b from a lower chiller unit 30 disposed outside the susceptor support 14 so as to control a process temperature of the semiconductor wafer W held on the susceptor 16 by using a temperature of the refrigerant.

Also, a heat-transfer gas, e.g., an He gas, supplied from a heat-transfer gas supply mechanism (not shown) is supplied between an upper surface of the electrostatic chuck 18 and a rear surface of the semiconductor wafer W via a gas supply line 32.

An upper electrode 34 is disposed above the susceptor 16, which is a lower electrode, to face the susceptor 16 in parallel. A space between the upper and lower electrodes 34 and 16 is a space where plasma is to be generated. The upper electrode 34 faces to the semiconductor wafer W held on the susceptor 16, which is the lower electrode, to be a surface that contacts the space where plasma is to be generated, that is, a facing surface.

The upper electrode 34 is supported by an upper portion of the chamber 10 by interposing an insulating shield member 42. The upper electrode 34 includes an electrode plate 36, which constitutes a surface facing the susceptor 16 and has a plurality of gas ejection holes 37, and an electrode support 38 detachably supporting the electrode plate 36 and formed of a conductive material, e.g., aluminum. A low resistant conductor or a semiconductor that generates a small amount of Joule heat may be preferably used for forming the electrode plate 36. Also, a silicon-containing material is preferably used from the viewpoint of reinforcement of a resist as will be described later. For example, a proper material for forming the electrode plate 36 may be silicon or SiC. A gas diffusion chamber 40 is provided in the electrode support 38, and a plurality of gas through holes 41 communicated with the gas ejection holes 37 extend downward from the gas diffusion chamber 40. The gas diffusion chamber 40 is divided into a central chamber 40a and an edge chamber 40b by an annular barrier wall member 44 formed of, for example, an O-ring.

A plurality of process gases and a purge gas are supplied at a desired flow rate ratio from the gas supply unit 48 to the central chamber 40a and the edge chamber 40b. The gas supply unit 48 includes a gas box 49 and a gas supply pipe. In the gas box 49, the plurality of process gases and the purge gas are supplied to the gas supply pipe 54, which is commonly used, via respective individual gas supply pipes 50, and each of the gas supply pipes 50 includes a flow controller for controlling a flow rate of each gas, for example, a mass flow controller (MFC) 51, and opening/closing valves 52 disposed at front and rear sides of the MFC 51. Also, any of various other flow controllers, such as an FCS, may be used instead of the mass flow controller (MFC) 51. The process gas is properly selected according to a film to be etched.

The gas supply pipe 54, which is commonly used, branches into a central pipe 54a and an edge pipe 54b that are respectively connected to the central chamber 40a and the edge chamber 40b, and predetermined process gases are supplied at a predetermined flow rate ratio to the central pipe 54a and the edge pipe 54b through a flow splitter 56. Also, an opening/closing valve 55 is disposed on an upstream portion of a branch part of the gas supply pipe 54.

The flow splitter 56 includes flow control valves 57a and 57b that are respectively disposed in the central pipe 54a and the edge pipe 54b, pressure indicators 58a and 58b that are respectively disposed in the central pipe 54a and the edge pipe 54b to measure gas-pressure inside the central pipe 54a and the edge pipe 54b, and a flow controller 60 for controlling actuators 59a and 59b of the flow control valves 57a and 57b and controlling opening degree of the flow control valves 57a and 57b to have predetermined values so that flow rates of gases flowing to the central pipe 54a and the edge pipe 54b have predetermined values based on pressure values measured by the pressure indicators 58a and 58b. That is, in that the gas-pressure inside the pipe is proportional to the flow rates of the gases inside the pipe, the flow controller 60 controls opening degree of the flow control valves 57a and 57b so that the pressure values of the central pipe 54a and the edge pipe 54b measured by the pressure indicators 58a and 58b correspond to a predetermined flow rate ratio.

The process gases distributed at a predetermined flow rate ratio to the central pipe 54a and the edge pipe 54b reach the central chamber 40a and the edge chamber 40b of the gas diffusion chamber 40. The process gases are individually discharged in the form of shower from the central chamber 40a and the edge chamber 40b to the space where plasma is to be generated via the gas through holes 41 and the gas ejection holes 37. In other words, the upper electrode 34 serves as a shower head that may supply a process gas when a flow rate ratio to a central portion and an edge portion is controlled.

A temperature control unit 62 for controlling a temperature of the upper electrode 34 is disposed in the electrode support 38 of the upper electrode 34. The temperature control unit 62 includes: a refrigerant chamber 63 that is provided in, e.g., the electrode support 38, and holds a refrigerant such as cooling water; refrigerant pipes 64 and 65 connected to the refrigerant chamber 63; an upper chiller unit 66 for cyclically supplying the refrigerant to the refrigerant chamber 63 via the refrigerant pipes 64 and 65; a heater 67 disposed on an upper surface of the electrode support 38; a heater power source 68 for feeding power to the heater 67; and a temperature controller 70 for controlling a flow rate of the refrigerant of the upper chiller unit 66 and a current value of the heater power source 68.

A variable DC power source 74 is electrically connected to the upper electrode 34 via a low pass filter (LPF) 72. The variable DC power source 74 may be a bipolar power source. Power-feeding of the variable DC power source 74 may be switched on or off by an on/off switch 73.

The low pass filter (LPF) 72 traps high frequency applied from first and second high frequency power sources, which will be described later, and may be configured as an LR filter or an LC filter.

A grounding conductor 10a having a cylindrical shape is disposed to extend upwardly from a lateral wall of the chamber 10 to be higher than the upper electrode 34.

The first high frequency power source 88 is electrically connected to the susceptor 16, which is the lower electrode, via a first matcher 87. When high frequency power is applied to the susceptor 16, which is the lower electrode, from the first high frequency power source 88, plasma is generated in the chamber 10. The first high frequency power source 88 outputs high frequency power of from about 27 to about 100 MHz, for example, 40 MHz. The first matcher 87 matches an internal impedance (or an output impedance) of the first high frequency power source 88 with a load impedance to make the output impedance of the first high frequency power source 88 when plasma is generated in the chamber 10 be the same as the load impedance in appearance.

Also, the second high frequency power source 90 is electrically connected to the susceptor 16, which is the lower electrode, via a second matcher 89. When high frequency power is applied to the susceptor 16, which is the lower electrode, from the second high frequency power source 90, a high frequency bias is applied to the semiconductor wafer W, and thus ions are dragged into the semiconductor wafer W. The second high frequency power source 90 outputs high frequency power of from about 400 kHz to about 20 MHz, for example, 13 MHz. The second matcher 89 matches an internal impedance (or an output impedance) of the second high frequency power source 90 with a load impedance to make the internal impedance of the second high frequency power source 90 when plasma is generated in the chamber 10 be the same as the load impedance including the plasma in the chamber 10 in appearance.

An exhaust port 80 is provided at a lower portion of the chamber 10, and an exhauster 84 is connected to the exhaust port 80 via an exhaust pipe 82. The exhauster 84 has a vacuum pump, e.g., a turbo molecular pump, to depressurize the inside of the chamber 10 to a desired vacuum level. A pressure control valve (not shown) that controls the pressure inside the chamber 10 by adjusting an exhaust volume is disposed in the exhaust pipe 82. Also, an inlet/outlet 85 for the semiconductor wafer W is provided in the lateral wall of the chamber 10, and the inlet/outlet 85 may be opened and closed by a gate valve 86. In addition, a deposition shield 11 for preventing etching deposition from depositing inside the chamber 10 is detachably disposed along an inner wall of the chamber 10. In other words, the deposition shield 11 constitutes a chamber wall. The deposition shield 11 is also disposed on an outer circumference of the inner wall member 26. An exhaust plate 83 is disposed between the deposition shield 11 adjacent to the wall of a lower part of the chamber 10 and the deposition shield 11 adjacent to the inner wall member 26. A proper material for forming the deposition shield 11 and the exhaust plate 83 may be aluminum coated with ceramics, for example, $Y_2O_3$.

A conductive member (GND block) 91, which is galvanically-connected to a ground, is disposed on the deposition shield 11 adjacent to the inner wall of the chamber 10 that is on approximately a level with the semiconductor wafer W, and thus the conductive member (GND block) 91 may prevent an abnormal discharge from generating.

Components of a plasma etching apparatus, for example, a power system, a gas supply system, a driving system, the first high frequency power source 88, the second high frequency power source 90, the first and second matchers 87 and 89, the DC power 22, the variable DC power source 74, etc., are connected to and controlled by a controller (an integrated controller) 100 including a micro processor (a computer). Also, a user interface 101, which includes a keyboard for performing, for example, input manipulation of commands to allow an operator to manage the plasma etching apparatus, a display for visualizing and displaying operating situations of the plasma etching apparatus, and the like, is connected to the controller 100.

In addition, a memory unit 102, which stores a control program for executing various processes performed by the plasma etching apparatus under the control of the controller 100 or stores a program, i.e., a process recipe, for allowing the components of the plasma etching apparatus to perform respective processes according to process conditions, is connected to the controller 100. The process recipe is stored in a non-transitory computer-readable medium included in the memory unit 102. The non-transitory computer-readable medium may be a hard disc or a semiconductor memory, or may be a portable type medium such as a CD-ROM, a DVD, or a flash memory device. Also, the process recipe may be suitably transmitted from another device via, for example, a dedicated line.

In addition, if necessary, an arbitrary process recipe is invoked from the memory unit 102 and executed by the controller 100 in response to an instruction or the like from the user interface 101, and thus a desired process is performed in the plasma etching apparatus under the control of the controller 100.

Figure 2:
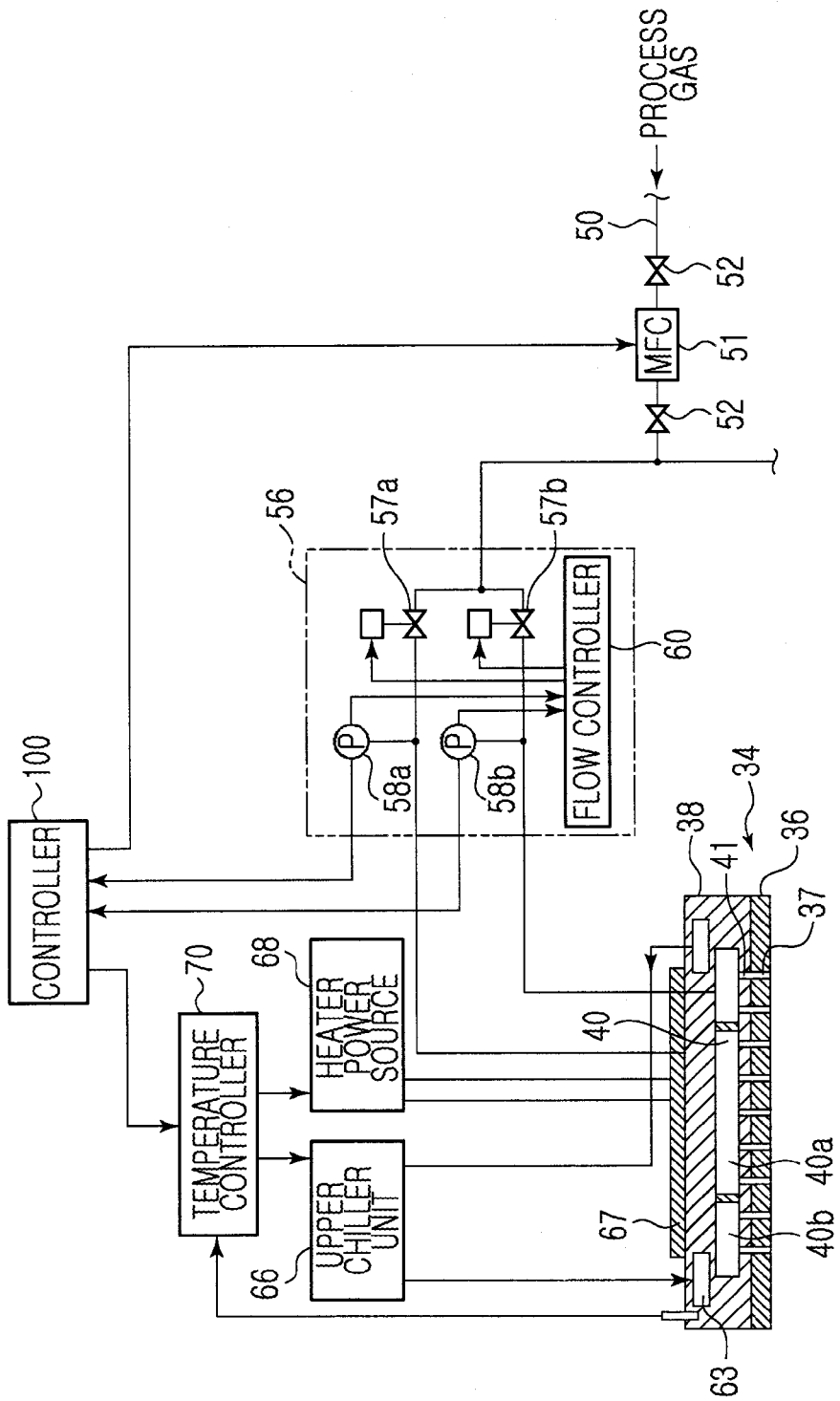
FIG. 2 is a view for describing a control system for controlling an upper electrode's temperature and the like by measuring a degree of consumption of an electrode plate from a detected value of a pressure indicator of a gas supply pipe so as to resolve a variation in etching rate resulting due to the degree of consumption of the electrode plate.

Also, in the present embodiment, the controller 100 receives a value(s) of the pressure indicator 58a and/or the pressure indicator 58b of the flow splitter 56 and measures a degree of consumption of the electrode plate 36 from a variation in the value(s), and thus the controller 100 may adjust process conditions to resolve the variation in etching rate based on the degree of consumption of the electrode plate 36. In the present embodiment, in detail, as shown in FIG. 2, the controller 100 receives the value(s) of the pressure indicator 58a and/or the pressure indicator 58b of the flow splitter 56, and accordingly, the controller 100 adjusts a setting temperature of the temperature control unit 62, that is, a temperature of the upper electrode 34, or a setting value of a flow controller such as the mass flow controller (MFC) 51, that is, a flow rate of the process gas. The etching rate also varies according to other process conditions, for example, pressure inside the chamber 10, and thus the other process conditions under which the etching rate varies may be adjusted.

Hereinafter, operations of the plasma processing apparatus having the above-described configuration will be described.

First, the gate valve 86 is opened, and the semiconductor wafer W, which is an object to be etched, is transferred into the chamber through the inlet/outlet 85 and is put on the susceptor 16. In this regard, a film to be etched is not particularly limited, but may be suitably applied to resist etching, that is, ashing.

Then, the gate valve 86 is closed, and while gas inside the chamber 10 is exhausted by the exhauster 84, a predetermined process gas inside the gas box 49 is supplied to the gas supply pipe 54, which is commonly used, by controlling a flow rate of the process gas under the control of a flow controller such as the mass flow controller (MFC) 51. The process gas supplied to the gas supply pipe 54 is distributed at a predetermined flow rate ratio to the central pipe 54a and the edge pipe 54b by the flow splitter 56 to be respectively supplied to the central chamber 40a and the edge chamber 40b of the gas diffusion chamber 40 and the distributed process gases are independently supplied to a central part and an edge part of the semiconductor wafer W in the chamber 10 via the gas through holes 41 and the gas ejection holes 37. As such, the flow rate ratio of the process gases supplied to the central part and the edge part of the semiconductor wafer W may be properly set by the flow splitter 56 to uniformly supply the process gas to the semiconductor wafer W.

Figure 3:
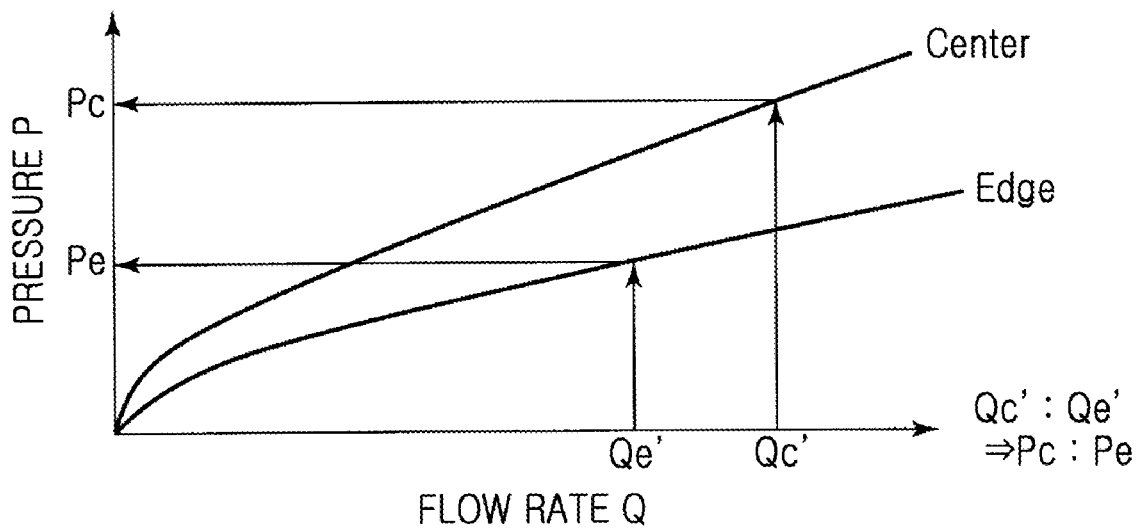
FIG. 3 is a graph showing a relationship between a flow rate Q of a process gas and pressure P of a pipe.

The flow rate ratio of the process gases is controlled by the flow splitter 56 as follows. First, on a display screen of the user interface 101, the flow rate of the process gas is set, and a flow rate ratio C:E of a flow rate of the process gas discharged from the central chamber 40a to a flow rate of the process gas discharged from the edge chamber 40b is set. The controller 100 calculates flow rates Qc' and Qe' of the process gases flowing to the central pipe 54a and the edge pipe 54b by multiplying the set flow rate ratio by a ratio of a number of gas holes of the central chamber 40a to a number of gas holes of the edge chamber 40b. A relationship between a flow rate Q of a process gas and pressure P of a pipe is as shown in FIG. 3, and the relationship is set as a predetermined conversion formula in the controller 100. Pressures Pc and Pe of the central pipe 54a and the edge pipe 54b are calculated by substituting the calculated flow rates Qc' and Qe' of the process gases into the conversion formula, and thereby a pressure ratio Pc/Pe is obtained and is output to the flow controller 60 of the flow splitter 56. Pressure values of the pressure indicators 58a and 58b are input to the flow controller 60, and the actuators 59a and 59b of the flow control valves 57a and 57b are controlled by the flow controller 60 so that the pressure values of the pressure indicators 58a and 58b have the pressure ratio Pc/Pe. As such, by controlling a flow rate of a process gas based on a value of a pressure indicator, the flow rate of the process gas may be rapidly controlled.

The process gas is properly selected according to a film to be etched. In the present embodiment, a film to be etched is not particularly limited, and thus the present embodiment may be used to etch various types, for example, an oxide film, a nitride film, or a low dielectric film (a low-k film). However, the present embodiment is preferably used to etch (ash) a resist film. In an ashing process of the resist film, an oxygen-containing gas, such as $O_2$ or $CO_2$, may be suitably used. The oxygen-containing gas may be used by being mixed with a dilution gas such as Ar gas.

Pressure inside the chamber 10 is controlled to be a predetermined pressure by a pressure control valve (not shown) by operating the exhauster 84 while supplying the process gas as described above. When an ashing process is performed on the resist film, the pressure inside the chamber is controlled to be in a range of, for example, about 0.015 to about 0.10 Torr (from about 2.00 to about 13.33 Pa). In this state, high frequency power for generating plasma having a frequency of about 27 to about 100 MHz, for example, a relatively high frequency of 40 MHz, is applied from the first high frequency power source 88 to the susceptor 16 which is the lower electrode. Also, high frequency power for dragging ions having a frequency of about 400 kHz to about 20 MHz, for example, a frequency of about 13 MHz that is lower than that of the high frequency power for generating plasma, is applied as a high frequency bias from the second high frequency power source 90 to the susceptor 16. In addition, as necessary, a negative DC voltage from the variable DC power source 74 is applied to the upper electrode 34, and plasma of the process gas is generated, and thus the resist film of the semiconductor wafer W is plasma-etched (ashed). When plasma is generated, a DC voltage is applied from the DC power 22 to the electrode 20 of the electrostatic chuck 18, and thus the semiconductor wafer W is attached to the electrostatic chuck 18.

After the plasma etching process is performed for a predetermined period of time, the inside of the chamber 10 is purged by a purge gas, and the gate valve 86 is opened to transfer out the semiconductor wafer W via the inlet/outlet 85, and thus a single etching operation is finished.

If the plasma etching process (ashing) is repeatedly performed to a plurality of the semiconductor wafers W, the electrode plate 36 of the upper electrode 34 is consumed. As such, if the electrode plate 36 is consumed, a thermal capacity of the electrode plate 36 is decreased, and thus a temperature of the electrode plate 36 is increased, thereby increasing an etching rate. Conventionally, the electrode plate 36 is replaced by measuring a degree of consumption of the electrode plate 36 beyond an allowable range of the consumption degree, but it is difficult to rapidly respond this.

Figure 4:
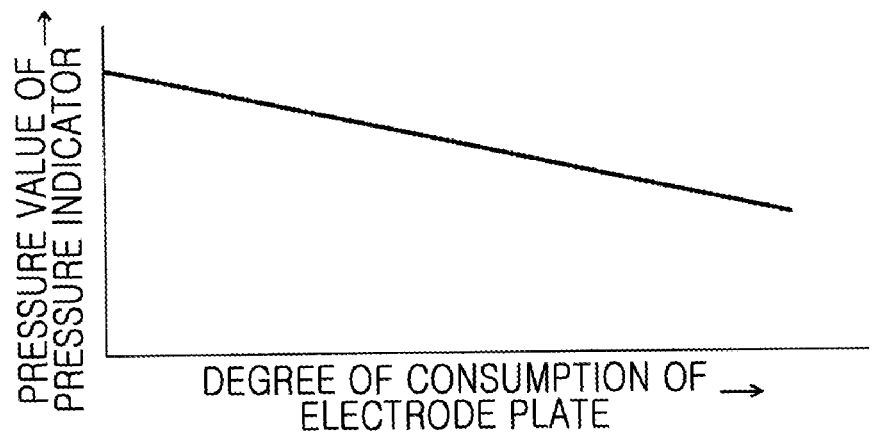
FIG. 4 is a graph schematically showing a relationship between a degree of consumption of an electrode plate and a pressure value of a pressure indicator.
Figure 9:
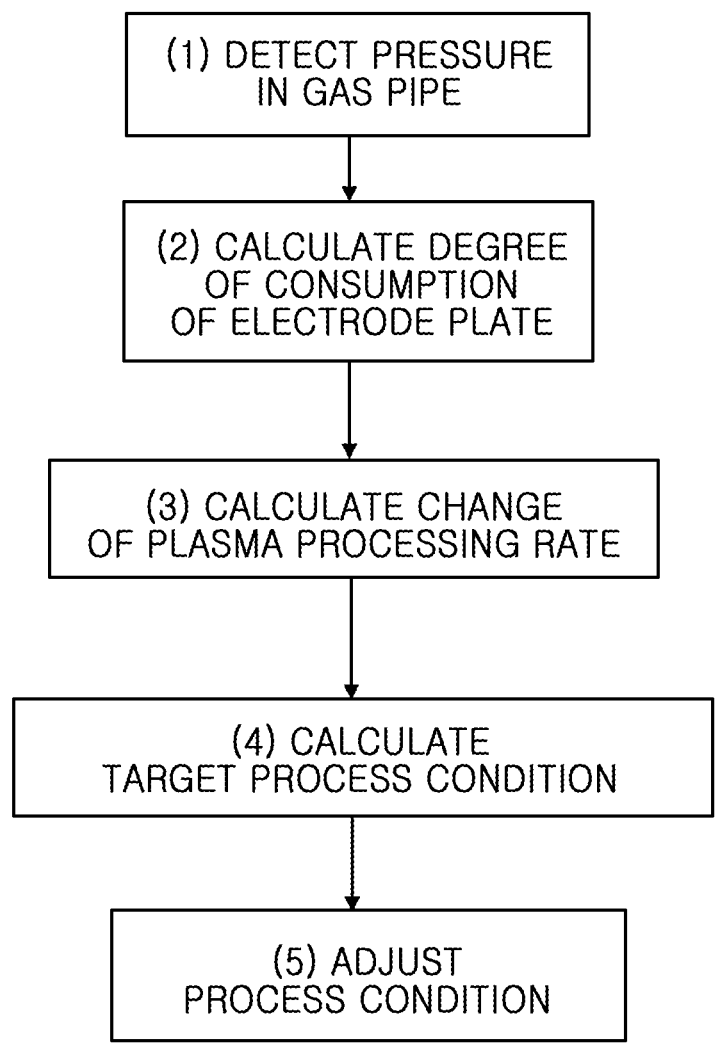
FIG. 9 is a flow chart showing operation of a controller.

Meanwhile, it was discovered that a variation in gas pressure inside a pipe reflects consumption of the electrode plate 36 with a high accuracy. In other words, the electrode plate 36 is almost uniformly consumed by repeating the plasma etching process, but the consumption of the electrode plate 36 leads to reduction in thickness of the electrode plate 36 and reduction in length of the pipe via which a process gas is supplied, and thus conductance of gas is improved and pressure inside the pipe is decreased. A relationship between a degree of consumption of the electrode plate and a pressure value of a pressure indicator is schematically shown in FIG. 4. Accordingly, in the present embodiment, as shown in FIG. 9, the degree of the consumption of the electrode plate 36 is measured from the value(s) of the pressure indicator 58a and/or the pressure indicator 58b (refer to (1) and (2) of FIG. 9). At this time, a variation in etching rate resulting due to the consumption of the electrode plate 36 is calculated (refer to (3) of FIG. 9) to adjust process conditions to resolve the variation in etching rate (refer to (4) and (5) of FIG. 9).

That is, since the etching rate may vary according to process conditions, for example, a temperature or a flow rate of a process gas, a relationship between a degree of consumption of the electrode plate 36 and the etching rate and a relationship between the process conditions and the etching rate are set in the controller 100, and the process conditions are adjusted to resolve the variation in etching rate corresponding to the degree of consumption of the electrode plate 36 based on the detected value(s) of the pressure indicator 58a and/or the pressure indicator 58b. Thus, the plasma etching process may be performed at an etching rate that is equivalent to that of the electrode plate 36 in an initial state.

Also, the degree of consumption of the electrode plate 36 may be measured from a thickness of the consumed electrode plate 36. Alternatively, in a case of an apparatus performing the same process, a degree of consumption of the electrode plate 36 may be measured from a use time of the electrode plate 36.

In the present embodiment, as shown in FIG. 9, the controller 100 receives pressure value(s) of the pressure indicator 58a and/or the pressure indicator 58b of the flow splitter 56 (refer to (1) of FIG. 9) and calculates a degree of consumption of the electrode plate 36 based on a variation in the pressure value(s) from an initial pressure value (refer to (2) of FIG. 9). An etching rate is controlled to be an initial value (refer to (5) of FIG. 9) by calculating an etching rate corresponding to the degree of consumption of the electrode plate 36 and a variation thereof from an initial etching rate (an etching rate when the degree of consumption is 0) (refer to (3) of FIG. 9), calculating a temperature of the upper electrode 34 or a flow rate of a process gas to resolve the variation (refer to (4) of FIG. 9), and sending the calculated temperature or flow rate to the temperature controller 70 or the mass flow controller (MFC) 51.

Accordingly, the consumed electrode plate 36 may be consistently etched at an etching rate equivalent to that when the electrode plate 36 is not consumed, thereby preventing a variation in etching rate resulting due to the consumption of the electrode plate 36.

Hereinafter, a verification experiment of the present invention will be described.

Herein, a result of ashing a resist by using $O_2$ gas as a process gas will be described.

Figure 5:
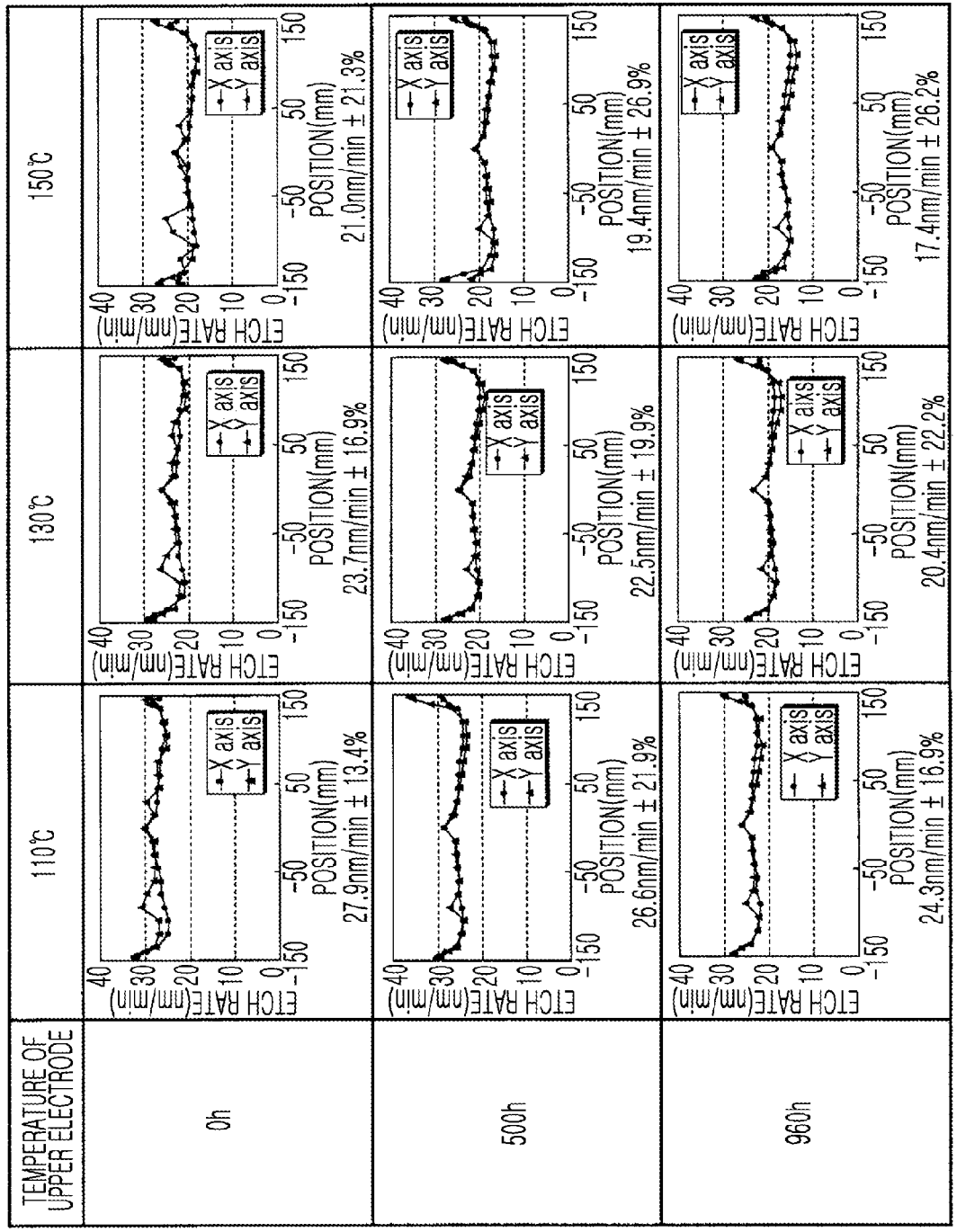
FIG. 5 is a table showing etching rates measured under various conditions by changing a use time of an electrode and a temperature of an upper electrode when a resist is ashed by using $O_2$ gas as a process gas.
Figure 6:
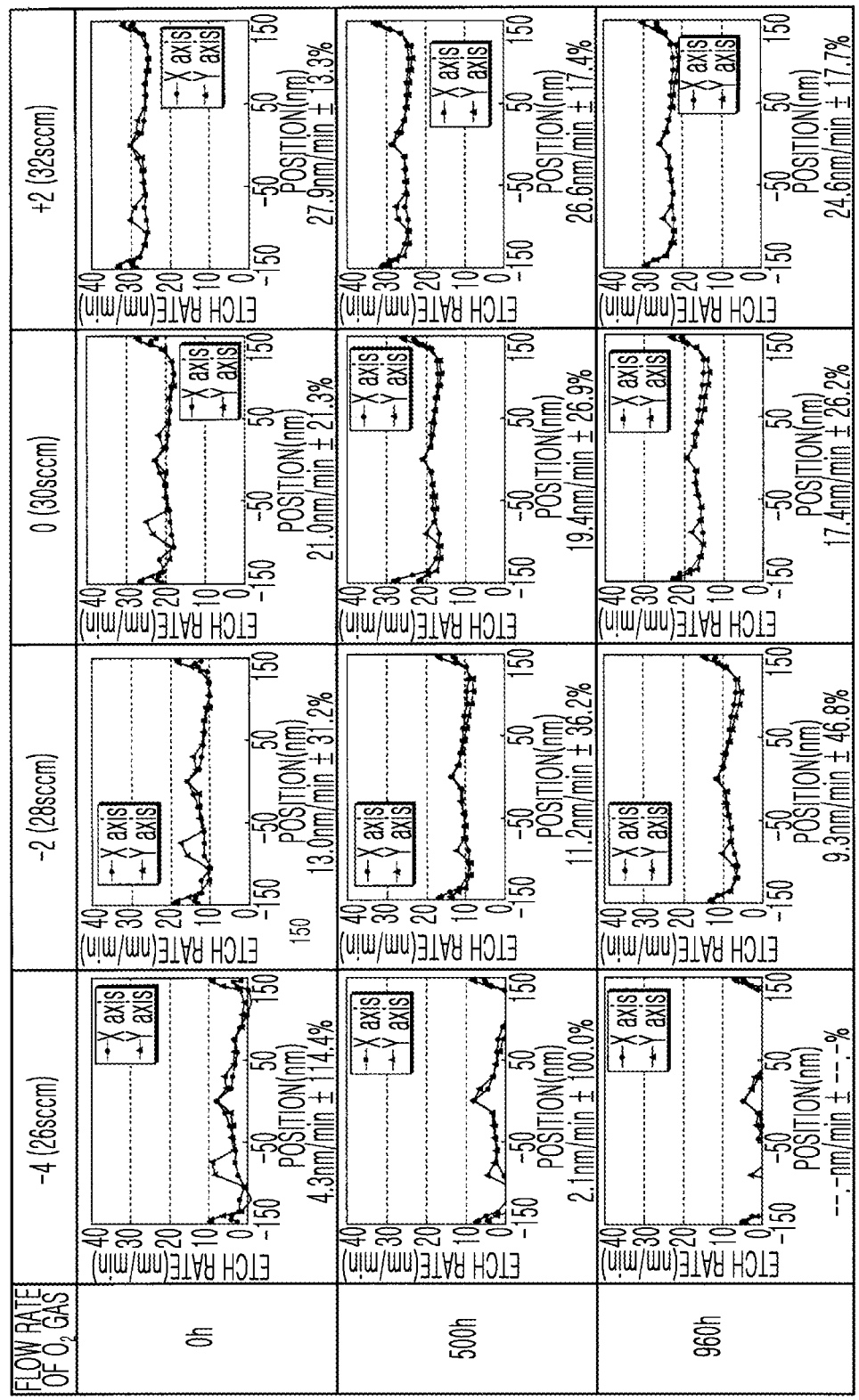
FIG. 6 is a table showing etching rates measured under various conditions by changing a use time of an electrode and a flow rate of $O_2$ gas when a resist is ashed by using $O_2$ gas as a process gas.

With regard to cases where use times of an electrode plate are 0, 500, and 960 hours, an etching rate was measured by changing a temperature of an upper electrode or a flow rate of $O_2$ gas as process conditions. As reference conditions, a temperature of the upper electrode was 150° C. and a flow rate of the $O_2$ gas was 30 sccm (ml/min). In this experiment, three temperatures of the upper electrode, that is, 110° C., 130° C., and 150° C., were set, and four flow rates of $O_2$ gas, that is, 26 sccm (−4), 28 sccm (−2), 30 sccm, and 32 sccm (+2), were set. Results thereof are shown in FIGS. 5 and 6. Referring to FIGS. 5 and 6, in the reference conditions, when the use times of the electrode plate are 0 hour and 960 hours, average values of an etching rate are 21.0 nm/min and 17.4 nm/min, respectively. Accordingly, when the electrode plate is consumed for 960 hours, the etching rate is decreased by 3.6 nm/min. Also, as the temperature of the upper electrode is increased, the etching rate is decreased, and as the flow rate of $O_2$ gas is increased, the etching rate is increased. In addition, a variation in etching rate of a resist film when the temperature of the upper electrode is changed by 10° C. almost corresponds to a variation in etching rate when a pressure value of a pipe is changed by 0.2 Torr. Consequently, the variation in etching rate of the resist film was about 2 nm/min.

Figure 7:
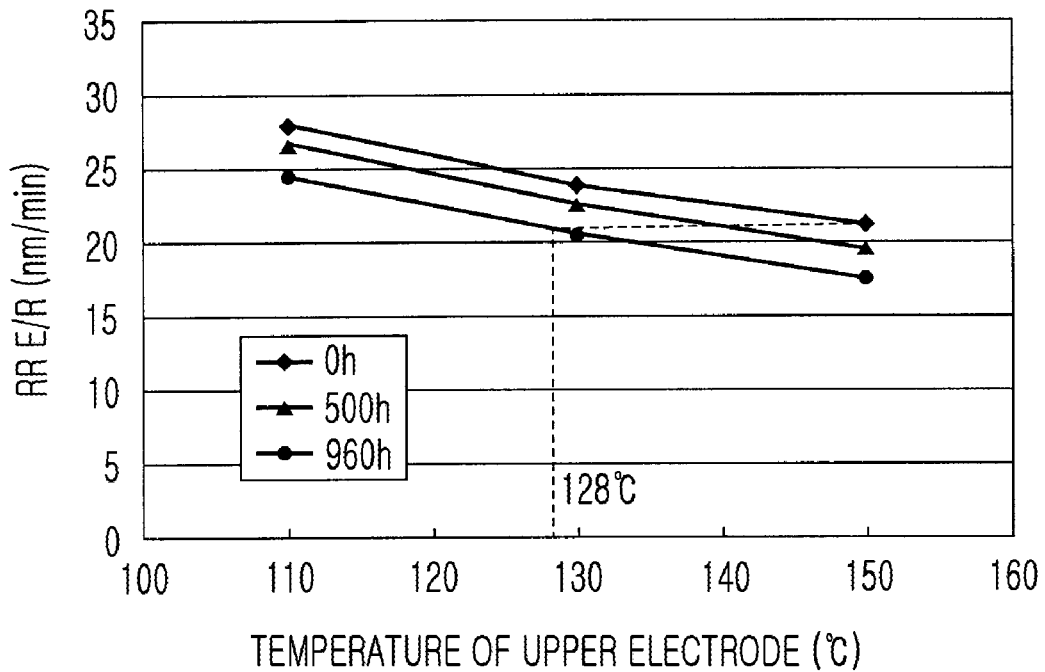
FIG. 7 is a graph showing a relationship between a temperature of an upper electrode and an etching rate to each use time of an electrode plate.
Figure 8:
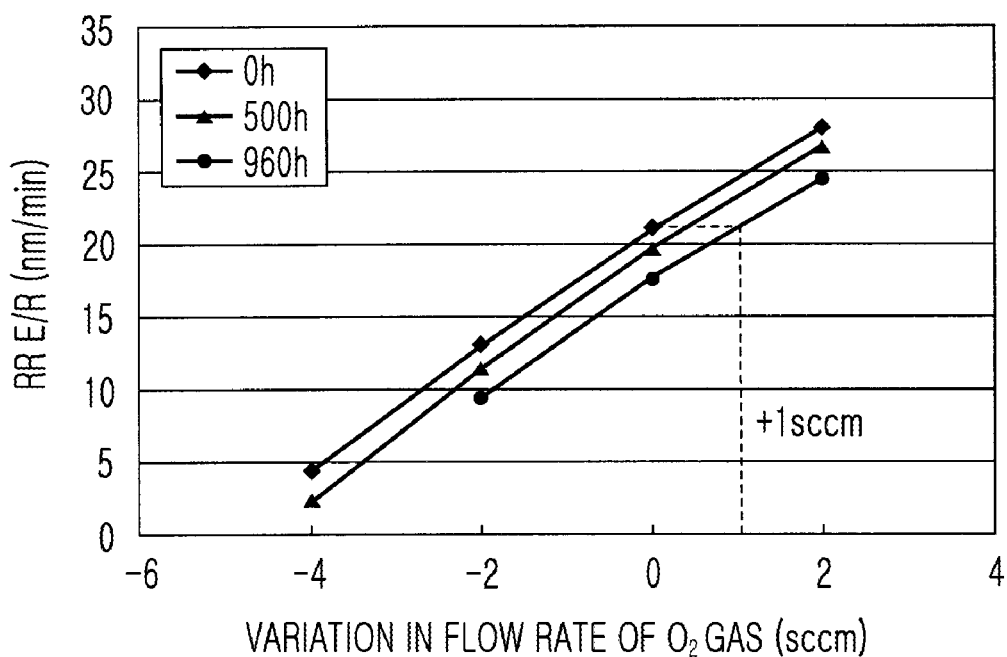
FIG. 8 is a graph showing a relationship between a variation in flow rate of $O_2$ gas and an etching rate to each use time of an electrode plate.

From these results, a relationship between a temperature of the upper electrode and an etching rate at different use times of the electrode plate is shown in FIG. 7, and a relationship between a variation in flow rate of $O_2$ gas and an etching rate is shown in FIG. 8.

Referring to FIG. 7, it is necessary to change the temperature of the upper electrode from 150° C. to 128° C. in order to make the electrode plate used for 960 hours have an etching rate that is the same as that of the electrode plate used for 0 hour. In other words, the variation in etching rate resulting due to consumption of the electrode plate may be almost canceled by changing the temperature of the upper electrode. Also, referring to FIG. 8, it is necessary to change the flow rate of $O_2$ gas from 30 sccm to 31 sccm in order to make the electrode plate used for 960 hours have an etching rate that is the same as that of the electrode plate used for 0 hour. In other words, the variation in etching rate resulting due to the consumption of the electrode plate may be almost canceled by changing the flow rate of a process gas.

From these results, it is verified that an etching rate according to the present invention may be adjusted.

Also, from the above-described results, when the temperature of the upper electrode is used, a variation in temperature of the electrode plate per 10 hours of a use time of the electrode plate is 0.23° C. which may be relatively controlled with a high accuracy, but when the flow rate of $O_2$ gas is used, the use time of the electrode plate is 960 hours and a variation in the flow rate of $O_2$ gas is only 1 sccm, which may be controlled with an accuracy lower than that in the case of changing the temperature of the upper electrode.

Also, the present invention is not limited to the above-described embodiments and may be embodied in various ways. For example, in the above-described embodiment, an apparatus for applying two high frequency powers having different frequencies to a lower electrode has been described. However, a single high frequency power for plasma generation may be applied to the lower electrode, or high frequency power may be applied to an upper electrode. Alternatively, high frequency power for plasma generation may be applied to the upper electrode, and high frequency power for biasing may be applied to the lower electrode. Also, a DC voltage is not necessarily applied to the upper electrode. Furthermore, a film to be etched and types of a process gas are not limited to the above-described embodiments, and process conditions to be controlled are not limited to a temperature of the upper electrode and a flow rate of the process gas. In addition, although a case where the present invention is applied to a plasma etching apparatus has been described in the above-described embodiment, any of various other plasma processings may be performed. Also, although an example where pressure inside a pipe is measured by using a pressure indicator used in a flow splitter has been described in the above-described embodiments, the present invention may be applied to a case where a process gas is supplied in one line. Also, although a semiconductor wafer is used as a substrate to be processed in the above-described embodiments, the substrate to be processed is not limited to the semiconductor wafer in principle, and any of various other substrates such as a flat panel display (FPD) may be used.

According to the present invention, a degree of consumption of an electrode plate is measured based on a detected value of pressure inside a gas pipe, and process conditions are adjusted to resolve the variation in process rate by calculating a variation in process rate resulting due to the consumption of the electrode plate. Thus, plasma processing may be consistently performed at an etching rate equivalent to that when the electrode plate is not consumed, thereby preventing the variation in process rate resulting due to the consumption of the electrode plate.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A plasma processing apparatus that performs plasma processing to a substrate to be processed by using plasma of a process gas, the plasma processing apparatus comprising:
   a process chamber which accommodates a substrate and of which an inside is capable of being evacuated;
   a lower electrode which is disposed in the process chamber and capable of holding the substrate;
   an upper electrode including an electrode plate which is disposed in the process chamber to face the lower electrode and has a plurality of gas ejection holes to supply a process gas toward the substrate, and a support body which supports the electrode plate and has a gas diffusion chamber connected to the gas ejection holes;
   a gas supply unit including a gas pipe which is connected to the gas diffusion chamber and supplies the process gas via a first flow rate controller, wherein the process gas passes through the gas pipe, diffuses in the gas diffusion chamber and is supplied toward the substrate through the gas ejection holes;
   a high frequency power application unit which applies high frequency power for plasma generation to at least one selected from among the upper electrode and the lower electrode;
   a pressure indicator which is configured to detect a pressure inside the gas pipe;
   a second flow rate controller which is configured to control a flow rate of the process gas in the gas pipe, and
   a controller which is configured to control the pressure indicator, the first flow rate controller and the second flow rate controller,
   herein the controller is configured to:
      by using a first relationship which is a previously set relationship between the pressure inside the gas pipe and a degree of consumption of the electrode plate, calculate the degree of consumption of the electrode plate which corresponds to the pressure inside the gas pipe detected by the pressure indicator;
      by using a second relationship which is a previously set relationship between the degree of consumption of the electrode plate and an etching rate of the electrode plate by setting a relationship between process conditions for a temperature of the upper electrode or the flow rate of the process gas and the etching rate in the controller, calculate an etching rate change which corresponds to the calculated degree of consumption of the electrode plate; and
      adjust the flow rate of the process gas by using the second flow rate controller, thereby resolving the etching rate change.

2. The plasma processing apparatus or claim 1, wherein the plasma processing is plasma etching.

3. The plasma processing apparatus of claim 2, wherein a target of the plasma etching is a resist film of the substrate.

4. The plasma processing apparatus of claim 1, wherein the gas pipe includes first and second pipes which supply the process gas so that the process gas is discharged from different areas of the electrode plate; and
   the gas supply unit comprises:
      a flow splitter which detects pressures inside the first and second pipes and distributes the process gas to the first and second pipes at a predetermined flow rate ratio based on the detected pressures, and
      the pressure indicator is used to detect the pressures inside the first and second pipes in the flow splitter.

5. The plasma processing apparatus of claim 1, wherein the degree of consumption of the electrode plate is determined by a thickness of the electrode plate or a use time of the electrode plate.

6. A plasma processing method used to perform plasma processing to a substrate to be processed by plasma of a process gas by using a plasma processing apparatus,
   the plasma processing apparatus comprising:
      a process chamber which accommodates a substrate and of which an inside is capable of being evacuated;
      a lower electrode which is disposed in the process chamber and capable of holding the substrate;
      an upper electrode including an electrode plate which is disposed in the process chamber to face the lower electrode and has a plurality of gas ejection holes to supply a process gas toward the substrate, and a support body which supports the electrode plate and has a gas diffusion chamber connected to the gas ejection holes;
      a gas supply unit including a gas pipe which is connected to the gas diffusion chamber and supplies the process gas via a first flow rate controller, wherein the process gas passes through the gas pipe, diffuses in the gas diffusion chamber and is supplied toward the substrate through the gas ejection holes;
      a pressure indicator which is configured to detect a pressure inside the gas pipe;
      a second flow rate controller which is configured to control a flow rate of the process gas in the gas pipe;
      a controller which is configured to control the pressure indicator, the first flow rate controller and the second flow rate controller; and
      a high frequency power application unit which applies high frequency power for plasma generation to at least one selected from among the upper electrode and the lower electrode,
   the plasma processing method comprising:
      detecting the pressure inside the gas pipe;
      by using a first relationship which is a previously set relationship between the pressure inside the gas pipe and a degree of consumption of the electrode plate, calculating the degree of consumption of the electrode plate which corresponds to the detected pressure inside the gas pipe;

by using a second relationship which is a previously set relationship between the degree of consumption of the electrode plate and an etching rate of the electrode plate by setting a relationship between process conditions for a temperature of the upper electrode or the flow rate of the process gas and the etching rate in the controller, calculating an etching rate change which corresponds to the calculated degree of consumption of the electrode plate; and adjusting the flow rate of the process gas by using the second flow rate controller, thereby resolving the etching rate change.

7. The plasma processing method of claim 6, wherein the plasma processing is plasma etching.

8. The plasma processing method of claim 7, wherein a target of the plasma etching is a resist film of the substrate.

9. The plasma processing method of claim 6, wherein the degree of consumption of the electrode plate is determined by a thickness or the electrode plate or a use time of the electrode plate.

* * * * *